(12) United States Patent
Uchida

(10) Patent No.: US 6,690,089 B2
(45) Date of Patent: Feb. 10, 2004

(54) SEMICONDUCTOR DEVICE HAVING MULTI-CHIP PACKAGE

(75) Inventor: Yasufumi Uchida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/234,104

(22) Filed: Sep. 5, 2002

(65) Prior Publication Data

US 2003/0214023 A1 Nov. 20, 2003

(30) Foreign Application Priority Data

May 15, 2002 (JP) ........................................ 2002/140824

(51) Int. Cl.$^7$ .................... H01L 23/02; H01L 23/48; H01L 23/52; H01L 29/40; H01L 23/28; H01L 23/29
(52) U.S. Cl. ...................... 257/686; 257/685; 257/777; 257/778; 257/788; 257/787
(58) Field of Search ................... 257/778, 787, 257/686, 777, 788, 685, 791, 792, 793, 794

(56) References Cited

U.S. PATENT DOCUMENTS

| | | | |
|---|---|---|---|
| 4,763,188 A | * | 8/1988 | Johnson ....................... 257/777 |
| 5,471,369 A | * | 11/1995 | Honda et al. ................ 361/813 |
| 6,072,243 A | * | 6/2000 | Nakanishi .................... 257/783 |
| 6,316,822 B1 | | 11/2001 | Venkateshwaran et al. |
| 2002/0153600 A1 | * | 10/2002 | Chang et al. ................ 257/676 |

FOREIGN PATENT DOCUMENTS

JP          07-030051          1/1995

* cited by examiner

Primary Examiner—Nathan J. Flynn
Assistant Examiner—Victor A. Mandala, Jr.
(74) Attorney, Agent, or Firm—Wenderoth, Lind & Ponack, L.L.P.

(57) ABSTRACT

A semiconductor device includes a first semiconductor element provided with bonding electrodes at a predetermined pitch and lead frames provided on the first semiconductor element which work as electrical inputs/outputs. The semiconductor device further includes a substrate provided on the lead frames that is provided with metal wirings having a predetermined pitch, and a second semiconductor element provided on the substrate and provided with bonding electrodes having substantially the same pitch as the metal wirings. The semiconductor device further includes solder balls for respectively electrically connecting the bonding electrodes provided on the second semiconductor element and the metal wirings formed on the substrate, first metal wires for respectively electrically connecting the bonding electrodes provided on the first semiconductor element and the lead frames, and second metal wires for respectively electrically connecting the metal wirings provided on the substrate and the lead frames.

28 Claims, 4 Drawing Sheets

SEMICONDUCTOR DEVICE HAVING MULTI-CHIP PACKAGE

BACKGROUND OF THE INVENTION

The present invention relates to a semiconductor device called a lead frame type MCP (Multi-Chip Package), wherein a plurality of semiconductor elements are mounted in one package and sealed with an encapsulating resin.

In a conventional MCP type semiconductor device, a first semiconductor chip or element is bonded to a chip mounting pad and inner lead portions of lead frames by virtue of a semiconductor element adhesive composed of an epoxy resin or the like. Bonding electrodes provided on the first semiconductor element are connected to their corresponding inner lead portions by first metal wires. Further, a second semiconductor chip or element is connected to the inner lead portions through solder balls. The first semiconductor element, the second semiconductor element, the inner lead portions and the respective connecting portions are sealed with a mold resin.

Bonding electrodes on the second semiconductor element are arranged with pitches ranging from about 80 μm to 200 μm. In order to connect the inner lead portions and the second semiconductor element, there is a need to set arraying pitches of the inner lead portions in a manner similar to the above (i.e. at pitches ranging from about 80 μm to 200 μm). However, a pitch of each inner lead portion is greater than about 180 μm. This is because of criteria of stable machining of each inner lead portion. Therefore, there are developed unmountable inner lead portions depending on the pitches of the bonding electrodes on the second semiconductor element. Thus, there were restrictions on applicable semiconductor elements. Namely, a problem arose in that the second semiconductor element having the bonding electrodes, whose arraying pitches were each about 180 μm or less, could not be mounted.

Since the inner lead portions are separated from one another, they easily deform due to vibrations developed during an assembly process and come into contact with an assembly device or the like. Therefore, there was a case in which tip pitches of the inner lead portions were misregistered with regard to the bonding electrodes on the second semiconductor element so that the inner lead portions and the bonding electrodes could not be connected.

Since the inner lead portions become non-uniform in height when they are deformed due to a reason similar to the above, there was a case in which a failure in connection of the second semiconductor element was encountered. Namely, there existed wide and narrow intervals between the inner lead portions and the second semiconductor element such that the solder balls and the inner lead portions were not brought into contact with the second semiconductor element at locations thereof separated from the inner lead portions by the wide interval, thereby causing failures in their connections.

Furthermore, since there is a need to connect bonding electrodes on the first semiconductor element and bonding electrodes on the second semiconductor element to the same inner lead portions, respectively (to share the use of the inner lead portions), only semiconductor elements having same pin assignments, or completely same semiconductor elements utilized in combination, could be mounted, such that scope of application of products was restricted.

SUMMARY OF THE INVENTION

The present invention provides a novel and improved semiconductor device capable of preventing deviations in pitch during an assembly process of semiconductor elements and inner lead portions to thereby prevent failures in their connections, thus making it possible to enhance reflow packaging of the semiconductor device and connection reliability relative to external thermal stress (change in temperature) subsequent to packaging of the semiconductor device. The present invention also provides a manufacturing method of the semiconductor device.

A semiconductor device of the present invention includes a first semiconductor element provided with bonding electrodes at predetermined widths, and lead frames provided on the first semiconductor element which work as electrical inputs/outputs. The semiconductor device further includes a substrate provided on the lead frames that is provided with metal wirings having a predetermined pitch, and a second semiconductor element provided on the substrate and provided with bonding electrodes having substantially the same pitch as the metal wirings. The semiconductor device further includes solder balls for respectively electrically connecting the bonding electrodes provided on the second semiconductor element and the metal wirings provided on the substrate, first metal wires for respectively electrically connecting the bonding electrodes provided on the first semiconductor element and the lead frames, and second metal wires for respectively electrically connecting the metal wirings provided on the substrate and the lead frames.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTIONS OF THE PREFERRED EMBODIMENTS

Figure 1:
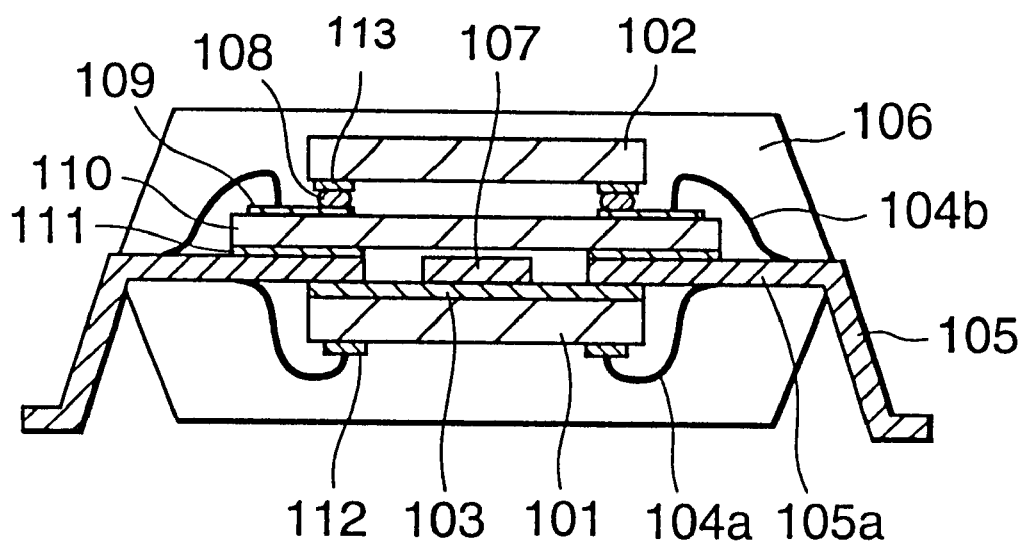
FIG. 1 is a cross-sectional view of a semiconductor device according to a first embodiment of the present invention.

Preferred embodiments of a semiconductor device according to the present invention and a manufacturing method thereof will hereinafter be described in detail with reference to the accompanying drawings. Incidentally, components each having substantially the same functional configuration in the present specification and the drawings are respectively identified by the same reference numerals and the description of certain common components will therefore be omitted.

FIG. 1 is an explanatory view showing a semiconductor device 100 according to a first embodiment.

In the semiconductor device 100, a first semiconductor chip or element 101 is bonded to a chip mounting pad 107 and inner lead portions 105a of lead frames 105 by virtue of a semiconductor element adhesive 103 such as an epoxy resin. Bonding electrodes 112 placed on the first semiconductor element 101, and the inner lead portions 105a are respectively connected to one another by first metal wires 104a. The first metal wires 104a are of components corresponding to the metal wires described in the related art. The lead portions 105a are on the semiconductor element 101 such that a single line can be passed through a thickness of one of the lead portions and the semiconductor element.

The first embodiment is characterized by the following structure.

A substrate 110 made up of a glass epoxy resin or the like is bonded to the inner lead portions 105a by a substrate adhesive 111 composed of an epoxy resin or a polyimide resin. A second semiconductor chip or element 102 is connected to metal wirings 109 mounted to the substrate 110 through solder balls 108. Pitches of the metal wirings 109 at their junctions are substantially the same as that of bonding electrodes 113 on the second semiconductor element 102. Further, the metal wirings 109 are connected to their corresponding inner lead portions 105a by virtue of second metal wires 104b.

The first semiconductor element 101, the second semiconductor element 102, the inner lead portions 105a and respective connecting portions are encapsulated in a mold resin 106.

According to the present embodiment as described above, the following advantageous effects are obtained.

Since the metal wirings 109 provided for the substrate 110 are formed on and fixed to the substrate 110 in advance, deviations in pitch and the like during an assembly process do not occur and a wiring pitch thereof is constant. It is therefore possible to prevent the metal wirings 109 and the bonding electrodes 113 on the second semiconductor element 102 from being mis-registered. Thus, the solder balls 108 and the metal wirings 109 can be reliably connected to one another.

Since the respective metal wirings 109 mounted to the substrate 110 become constant in height due to a similar reason, an interval between each of the solder balls 108 and its corresponding metal wiring 109 becomes constant, so that a failure in their connections can be prevented from occurring.

Since a reliable junction between the second semiconductor element 102 and the substrate 110 is implemented as described above, reflow packaging of the semiconductor device, and connection reliability relative to external thermal stress (change in temperature) subsequent to its packaging are enhanced.

Figure 2A:
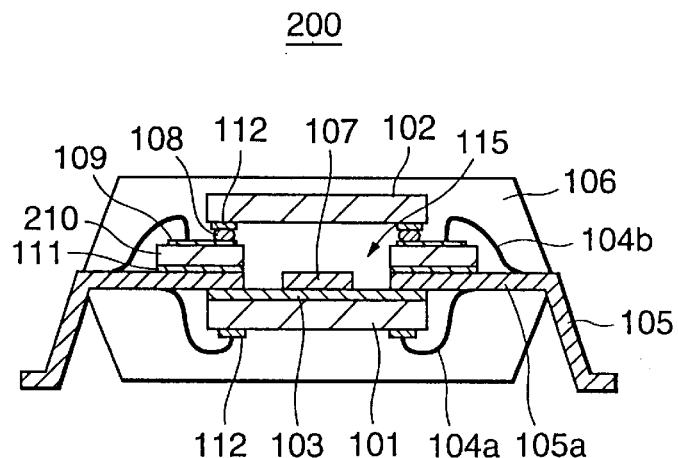
FIG. 2(A) is a cross-sectional view of a semiconductor device according to a second embodiment of the present invention.
Figure 2B:
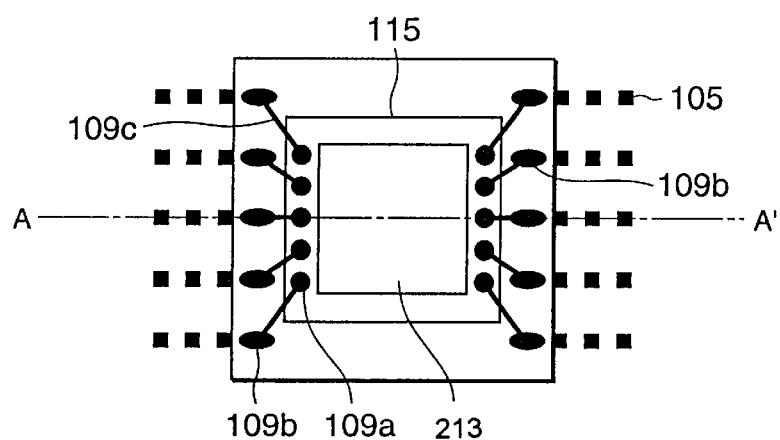
FIG. 2(B) is a plan view of the semiconductor device according to the second embodiment of the present invention.
Figure 2C:
FIG. 2(C) is a cross-sectional view taken along line A–A' of FIG. 2(B)

FIG. 2(A) is a cross-sectional view of a semiconductor device 200 according to a second embodiment, FIG. 2(B) is a plan view thereof, and FIG. 2(C) is a cross-sectional view taken along line A–A' of FIG. 2(B). The second embodiment is one which includes applied the semiconductor device 100 illustrated in the first embodiment and is characterized by a substrate's structure.

In the semiconductor device 200, solder-ball mounting pads 109a and wire-bonding pads 109b are provided on a substrate 210. These pads 109a and 109b are connected to one another by metal wiring patterns 109c.

A size of each solder-ball mounting pad 109a ranges from about 70 μm to 180 μm in diameter, and a pitch thereof is laid out at about 80 μm to 200 μm. Each of the wire-bonding pads 109b is shaped as an ellipse having a width of about 100 μm and a length of about 200 μm to 300 μm. In order to ensure adhesion to mold resin 106, resists 114 are coated onto the wiring patterns 109c as shown in FIG. 2(C). Further, metal wirings 109 are provided only on one side (upper side as viewed in a cross-sectional view taken along line A–A') of the substrate 210.

A resin inflow frame 213 is provided inside the solder-ball mounting pads 109a on the substrate 210.

Since other components are substantially identical to those of the semiconductor device 100 according to the first embodiment, description of these components will be omitted.

According to the second embodiment as described above, since the substrate 210 is provided with the resin inflow frame 213, the mold resin 106 can be charged through a resin inflow path 115. Thus, the same material as the mold resin 106 for sealing peripheries of the first semiconductor element 101 and the second semiconductor element 102 can be used for charging between the first semiconductor element and the second semiconductor element. Since the same resin is used, generation of a thermal stress due to a difference in linear expansion coefficient can be suppressed, and solder resistance and thermal resistance equivalent to a conventional structure can be ensured.

FIGS. 3(A) through 3(J) are respective explanatory views showing a method of manufacturing a semiconductor device of the present invention.

A method of manufacturing the semiconductor device 200 illustrated in the second embodiment will be described with reference to FIGS. 3(A) through 3(J) by way of example.

Figure 3A:
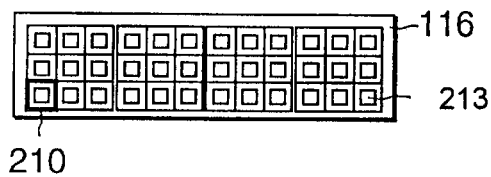
FIGS. 3(A) through 3(J) are respective views showing a method of manufacturing a semiconductor device of the present invention.

As shown in FIG. 3(A), substrates 210 equipped with resin inflow frames 213 in advance are formed in a substrate block 116. Incidentally, if substrates unequipped with such resin inflow frames are used, then semiconductor devices 100 as illustrated in the first embodiment can also be manufactured.

Figure 3B:
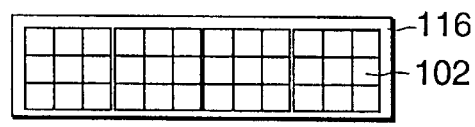

Next, second semiconductor elements 102 are mounted over the substrate block 116 as shown in FIG. 3(B). As shown in FIG. 3(C), the second semiconductor elements 102 are collectively flip-chip packaged over solder ball pads 109b on the substrates 210 of the substrate block 116 with solder balls 108 interposed therebetween. Ones subsequent to their packaging are formed as shown in FIG. 3(D). From the above, the substrate block 116 equipped with the second semiconductor elements 102 on respective substrates 210 is completed.

Figure 3E:
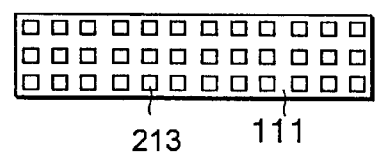
Figure 3C:
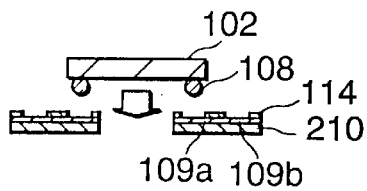

As shown in FIG. 3(E), a film-shaped substrate adhesive 111 having holes defined at corresponding positions of the resin inflow frames 213 is applied to a surface of the substrate block 116, which is opposite to a surface thereof for mounting the second semiconductor elements 102. The substrate adhesive 111 is composed of a polyimide resin or an epoxy resin. Incidentally, when substrates provided with no resin inflow frames are used, such a film-shaped substrate adhesive having no such holes is used in such a process step as shown in FIG. 3(A).

Figure 3F:
Figure 3D:
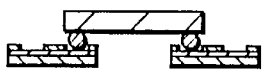

A method of applying the substrate adhesive 111 will be described in detail with reference to FIG. 3(F).

A description will be made of an example in which thermoplastic polyimide resin film "DF400" manufactured by Hitachi Chemical Co., Ltd. is used as the substrate adhesive 111 by way of example. A heater table 124 subjected to Teflon coating or the like is heated at about 100° C. to 180° C., and the substrate adhesive 111 is laid thereon. The substrate block 116 is placed above the substrate adhesive 111 while the substrate block is being positioned relative to the substrate adhesive. When left standing for about 1 to 2 minutes, the substrate adhesive 111 is bonded to the substrate block 116. Next, the substrate block 116 is lifted from the heater table 124 so that the substrate block 116 with the substrate adhesive 111 attached thereto is completed. Since the heater table 124 has been Teflon-coated, the substrate adhesive 111 does not remain on the heater table 124.

Figure 3G:
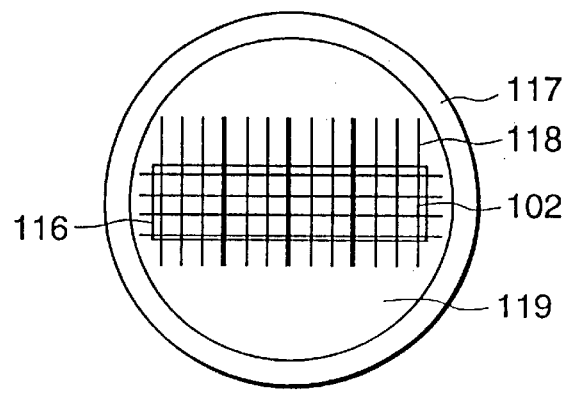

As shown in FIG. 3(G), a surface for the substrate adhesive 111, of the substrate block 116 equipped with the substrate adhesive 111, is bonded to a mount tape 119. Here, the mount tape 119 has been fixed to a wafer ring 117. A mounting surface for the substrate block 116, of the mount tape 119 has been coated with an adhesive. This adhesive, may be, for example, an ultraviolet cured adhesive like "D~675" manufactured by LINTEC Corporation. After the substrate block 116 has been mounted to the mount tape 119, the substrate block is fractured into pieces for every substrate 210 along scribe lines 118 through use of a standard scribe process step, whereby substrates 210 each equipped with a second semiconductor element 102 are completed.

Figure 3H:
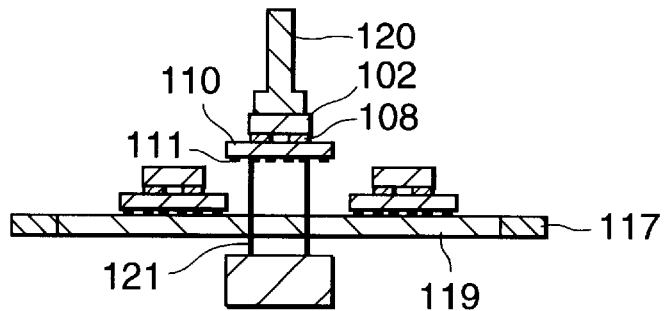

Thereafter, as shown in FIG. 3(H), a standard die bonder for each semiconductor element is used to thrust upwardly a periphery of the resin inflow frame 213 of each substrate 210 by virtue of upthrust pins 121, whereby a corresponding second semiconductor element 102 is absorbed by a suction collet 120.

Figure 3I:
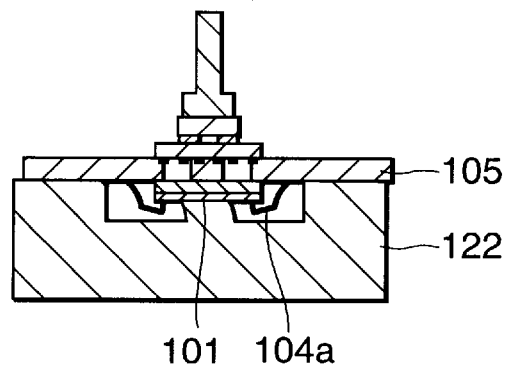

As shown in FIG. 3(I), lead frames 105 having a first semiconductor element 101 placed therebelow in advance, and with wire bonding having been completed, are mounted on a die bond heater block 122, and substrate adhesive 111 and inner lead portions 105a are bonded to one another by performing thermocompression bonding. Here, the die bond heater block 122 is heated to approximately 100° C. to 200° C. and provides a temperature sufficient for a reaction temperature of the substrate adhesive 111.

Figure 3J:
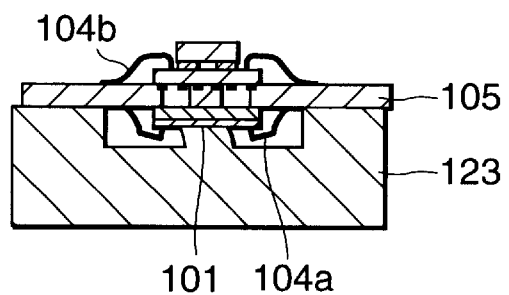

Next, as shown in FIG. 3(J), the lead frames 105 having the first semiconductor element 101 placed therebelow, with the wire bonding having been completed, are mounted on a wire bond heater block 123 during a wire bond process step, and wire-bonding pads 109b of each substrate 210 and their corresponding inner lead portions 105a are connected to one another by performing thermocompression bonding. Thereafter, the semiconductor device 200 shown in FIG. 2 is completed according to a standard mold process step.

According to the method as described above, the semiconductor device 200 according to the second embodiment can be easily manufactured. Incidentally, if a substrate not equipped with resin inflow frames and a substrate adhesive are used, then the semiconductor device 100 according to the first embodiment can be easily fabricated according to a similar method.

While preferred embodiments of the semiconductor device according to the present invention, and its manufacturing method have been described with reference to the accompanying drawings, the present invention is not limited to such examples. It will be apparent to those skilled in the art that various changes or modifications can be made to the invention within the scope of a technical idea described in the following claims. It is understood that those changes or modifications belong to the technical scope of the present invention.

According to the present invention as described above, since respective metal wirings provided for a substrate are formed on and fixed to the substrate in advance, deviations in pitch and the like during an assembly process do not occur and a wiring pitch is held constant. It is therefore possible to prevent the metal wirings and their corresponding bonding electrodes on a second semiconductor element from being mis-registered. Solder balls and the metal wirings can thus be reliably connected to one another.

Since the respective metal wirings mounted to the substrate become constant in height due to a similar reason, an interval between each of the solder balls and each of the metal wirings becomes constant, so that a failure in their connections can be prevented from occurring.

Furthermore, since a reliable junction between the second semiconductor element and the substrate is implemented as described above, reflow packaging of a semiconductor device, and connection reliability relative to external thermal stress (change in temperature) subsequent to its packaging are enhanced.

According to an application of the present invention, the same material as a mold resin for sealing peripheries of a first semiconductor element and a second semiconductor element can be used for charging between the first semiconductor element and the second semiconductor element. When the same resin is used, generation of thermal stress due to a difference in linear expansion coefficient can be suppressed, and solder resistance and thermal resistance equivalent to a conventional structure can be ensured.

According to the present invention as well, a semiconductor device can be easily manufactured which brings about the above excellent effects.

What is claimed is:

1. A semiconductor device to be sealed with an encapsulating resin, comprising:

a first semiconductor element having thereon first bonding electrodes at a first predetermined pitch;

lead frames on said first semiconductor element, said lead frames for performing electrical inputs/outputs from and to an exterior of the semiconductor device;

a substrate on said lead frames, said substrate having thereon metal wirings at a second predetermined pitch;

a second semiconductor element on said substrate, said second semiconductor element having thereon second bonding electrodes at a third pitch which is substantially equal to said second predetermined pitch;

solder for respectively electrically interconnecting said second bonding electrodes and said metal wirings;

first metal wires for respectively electrically interconnecting said first bonding electrodes and said lead frames; and second metal wires for respectively electrically interconnecting said metal wirings and said lead frames.

2. The semiconductor device according to claim 1, wherein said lead frames are on said first semiconductor element such that a first line passing through a thickness of one of said lead frames also passes through a thickness of said first semiconductor element, and a second line passing through a thickness of another of said lead frames also passes through the thickness of said first semiconductor element, with said first line being parallel to said second line.

3. The semiconductor device according to claim 2, further comprising:

a resin inflow frame positioned inwardly of said metal wirings relative to an exterior of the semiconductor device, said resin inflow frame for allowing encapsulating resin to flow between said first semiconductor element and said second semiconductor element.

4. The semiconductor device according to claim 2, wherein
said first metal wires are positioned inwardly of said second metal wires, respectively, relative to an exterior of the semiconductor device.

5. The semiconductor device according to claim 2, wherein said metal wirings are only on one surface of said substrate.

6. The semiconductor device according to claim 1, wherein
said lead frames are on said first semiconductor element via an adhesive positioned between and in contact with said first semiconductor element and one of said lead frames, and via an adhesive positioned between and in contact with said first semiconductor element and another of said lead frames, and
said substrate is on said lead frames via an adhesive positioned between and in contact with said substrate and said one of said lead frames, and via an adhesive positioned between and in contact with said substrate and said another of said lead frames.

7. The semiconductor device according to claim 1, further comprising:
a resin inflow frame positioned inwardly of said metal wirings relative to an exterior of the semiconductor device, said resin inflow frame for allowing encapsulating resin to flow between said first semiconductor element and said second semiconductor element.

8. The semiconductor device according to claim 1, wherein
said first metal wires are positioned inwardly of said second metal wires, respectively, relative to an exterior of the semiconductor device.

9. The semiconductor device according to claim 1, wherein said metal wirings are only on one surface of said substrate.

10. A semiconductor device comprising:
lead frames;
a first semiconductor element including a first surface having thereon first bonding electrodes, and also including a second surface opposite to said first surface and attached to said lead frames;
a substrate including a third surface having thereon conductive patterns, and also including a fourth surface opposite to said third surface and attached to said lead frames;
a second semiconductor element including a fifth surface having thereon second bonding electrodes connected to said conductive patterns, respectively, and also including a sixth surface opposite to said fifth surface;
first wires respectively electrically interconnecting said first bonding electrodes and said lead frames;
second wires respectively electrically interconnecting said conductive patterns and said lead frames; and
a molding resin covering said first and second semiconductor elements, said substrate, said first and second wires, and a portion of said lead frames.

11. The semiconductor device according to claim 10, wherein said second surface is attached to said lead frames such that a first line passing through a thickness of one of said lead frames also passes through a thickness of said first semiconductor element defined between said first and second surfaces, and a second line passing through a thickness of another of said lead frames also passes through the thickness of said first semiconductor element, with said first line being parallel to said second line.

12. The semiconductor device according to claim 11, wherein said conductive patterns include electrode portions spaced from one another by a first interval, and
said second bonding electrodes are spaced from one another by a second interval that is equal to said first interval.

13. The semiconductor device according to claim 12, wherein said lead frames are spaced from one another by a third interval that is greater than said first interval.

14. The semiconductor device according to claim 11, wherein said second bonding electrodes comprise solder.

15. The semiconductor device according to claim 11, wherein said fourth surface is attached to said lead frames via an adhesive.

16. The semiconductor device according to claim 15, wherein said adhesive comprises an epoxy resin.

17. The semiconductor device according to claim 15, wherein said adhesive comprises a polyamide resin.

18. The semiconductor device according to claim 11, wherein said substrate comprises a glass epoxy resin.

19. The semiconductor device according to claim 11, wherein said substrate includes a through hole at a central portion thereof.

20. The semiconductor device according to claim 10, wherein
said second surface is attached to said lead frames via an adhesive positioned between and in contact with said second surface and one of said lead frames, and via an adhesive positioned between and in contact with said second surface and another of said lead frames, and
said fourth surface is attached to said lead frames via an adhesive positioned between and in contact with said fourth surface and said one of said lead frames, and via an adhesive positioned between and in contact with said fourth surface and said another of said lead frames.

21. The semiconductor device according to claim 10, wherein
said conductive patterns include electrode portions spaced from one another by a first interval, and
said second bonding electrodes are spaced from one another by a second interval that is equal to said first interval.

22. The semiconductor device according to claim 21, wherein said lead frames are spaced from one another by a third interval that is greater than said first interval.

23. The semiconductor device according to claim 10, wherein said second bonding electrodes comprise solder.

24. The semiconductor device according to claim 10, wherein said fourth surface is attached to said lead frames via an adhesive.

25. The semiconductor device according to claim 24, wherein said adhesive comprises an epoxy resin.

26. The semiconductor device according to claim 24, wherein said adhesive comprises a polyamide resin.

27. The semiconductor device according to claim 10, wherein said substrate comprises a glass epoxy resin.

28. The semiconductor device according to claim 10, wherein said substrate includes a through hole at a central portion thereof.

* * * * *